(12) United States Patent
Kikuchi et al.

(10) Patent No.: US 7,455,553 B2
(45) Date of Patent: Nov. 25, 2008

(54) SEMICONDUCTOR DEVICE WITH POWER MODULE AND AN INSULATING MEMBER PROVIDED BETWEEN A CONDUCTIVE CASING AND A NON-INSULATING PORTION

(75) Inventors: Takaji Kikuchi, Toyota (JP); Takeshi Menjo, Anjo (JP)

(73) Assignees: Toyota Jidosha Kabushiki Kaisha, Tokyo (JP); Kyoho Machine Works, Ltd., Aichi-ken (JP)

( * ) Notice: Subject to any disclaimer, the term of this patent is extended or adjusted under 35 U.S.C. 154(b) by 41 days.

(21) Appl. No.: 11/370,868

(22) Filed: Mar. 9, 2006

(65) Prior Publication Data

US 2006/0220236 A1    Oct. 5, 2006

(30) Foreign Application Priority Data

Mar. 17, 2005    (JP)    ............................. 2005-076756

(51) Int. Cl.
*H01R 13/648* (2006.01)
(52) U.S. Cl. .................................... 439/607
(58) Field of Classification Search ............ 439/607, 439/608, 108, 76.2, 211; 361/131, 697, 720, 361/818; 363/144; 257/532, 737
See application file for complete search history.

(56) References Cited

U.S. PATENT DOCUMENTS

| | | | | |
|---|---|---|---|---|
| 2,212,505 | A * | 8/1940 | Abbott | 439/535 |
| 6,352,446 | B2 * | 3/2002 | Ezawa et al. | 439/490 |
| 6,563,211 | B2 * | 5/2003 | Fukada et al. | 257/706 |
| 6,597,063 | B1 * | 7/2003 | Shimizu et al. | 257/687 |
| 6,661,659 | B2 * | 12/2003 | Tamba et al. | 361/699 |
| 6,791,170 | B1 * | 9/2004 | Fuku et al. | 257/678 |
| 7,301,755 | B2 * | 11/2007 | Rodriguez et al. | 361/676 |
| 2002/0047132 | A1 * | 4/2002 | Fukada et al. | 257/114 |
| 2004/0087217 | A1 * | 5/2004 | Hyland et al. | 439/676 |
| 2006/0114704 | A1 * | 6/2006 | Chen | 363/144 |

FOREIGN PATENT DOCUMENTS

| | | |
|---|---|---|
| JP | A 5-343871 | 12/1993 |
| JP | A-09-283883 | 10/1997 |
| JP | A 2004-247684 | 9/2004 |

* cited by examiner

*Primary Examiner*—Chandrika Prasad
(74) *Attorney, Agent, or Firm*—Oliff & Berridge, PLC

(57) ABSTRACT

An electrically insulating member is provided between a bus bar of an IPM and a nearby casing so as to electrically insulate the casing from the bus bar of the IPM. Above the portion where electrical insulation is necessary, a bracket provided for supporting a component-to-be supported is secured to the casing. The electrically insulating member is attached to a lower portion of the bracket that is an existing component.

8 Claims, 4 Drawing Sheets

SEMICONDUCTOR DEVICE WITH POWER MODULE AND AN INSULATING MEMBER PROVIDED BETWEEN A CONDUCTIVE CASING AND A NON-INSULATING PORTION

This nonprovisional application is based on Japanese Patent Application No. 2005-076756 filed with the Japan Patent Office on Mar. 17, 2005, the entire contents of which are hereby incorporated by reference.

BACKGROUND OF THE INVENTION

1. Field of the Invention

The present invention relates to semiconductor devices. In particular, the invention relates to a method of electrical insulation in the case where the insulation distance between a casing and a power module housed in the casing is insufficient.

2. Description of the Background Art

Japanese Patent Laying-Open No. 2004-247684 discloses a structure of a semiconductor device having an inverter casing in which an intelligent power module (hereinafter also referred to as "IPM") is housed. For this semiconductor device, a bus bar is provided on the upper side of the IPM. Further, the inverter casing is formed of a material having good thermal conductivity.

Although Japanese Patent Laying-Open No. 2004-247684 discloses no specific materials for the inverter casing, it is generally known that such materials as aluminum and iron are used for the inverter casing.

In recent years, with the energy-saving and environmental issues as a background, the hybrid vehicle having, as its motive-power sources, a DC supply, an inverter and a motor in addition to an engine has been of great interest and has already been in actual use.

The hybrid vehicle has a larger number of components mounted thereon such as the motor, inverter and high-voltage battery, as compared with the conventional motor vehicle having only an engine as a motive-power source. Therefore, for the hybrid vehicle, it is required to a great degree to downsize the mounted components and save space.

The inverter device is also required to decrease in size. Therefore, each of internal components themselves is decreased in size. Further, space is saved to the fullest extent. The realization of the space saving, however, could result in the case where a sufficient insulation distance between the electrically non-insulating portion of the IPM and the inverter casing cannot be ensured.

For example, regarding the semiconductor device disclosed in the above-referenced Japanese Patent Laying-Open No. 2004-247684 that has the high-voltage bus bar provided on the upper side of the IPM, space saving could result in an insufficient insulation distance between the bus bar and the inverter casing.

Then, the electrically non-insulating portion of the IPM may have electrical insulation capability or the inverter casing itself may have electrical insulation capability. These approaches, however, are generally accompanied by high costs and thus disadvantageous for the hybrid vehicle for which cost reductions are absolutely necessary.

Alternatively, an electrically insulating member may separately be provided to be attached to the inverter casing or IPM. These approaches, however, require an additional space for attaching the electrically insulating member to the inverter casing or IPM, thereby hindering realization of the space saving.

SUMMARY OF THE INVENTION

The present invention is accordingly made to solve the above-described problems. An object of the invention is to provide a semiconductor device for which electrical insulation between a casing and a power module housed in the casing can be ensured without hindrance to realization of space saving and cost saving.

According to the present invention, a semiconductor device includes: an electrically conductive casing; a power module portion housed in the casing and having at least one electrically non-insulating portion located near the casing; a component fixedly provided in the vicinity of the electrically non-insulating portion and within the casing and having a predetermined capability; and an electrically insulating member provided between the electrically non-insulating portion of the power module portion and the casing and attached to the component.

Preferably, the electrically insulating member includes: a support member attached to the component; and electrically insulating paper wrapped around the support member.

Still preferably, the electrically insulating member is made of a resin having electrical insulation property.

In the semiconductor device of the present invention, the electrically insulating member that is provided between the casing and the electrically non-insulating portion of the power module near the casing is fixedly provided in the vicinity of the electrically non-insulating portion and within the casing and is attached to an existing component having a predetermined capability. Therefore, it is unnecessary to provide an additional dedicated space for attaching the electrically insulating member. Further, it is also unnecessary to provide the electrical insulation capability, which could result in increase in cost, to the electrically non-insulating portion of the power module portion or the casing itself.

Thus, for the semiconductor device of the present invention, the electrical insulation between the electrically conductive casing and the electrically non-insulating portion of the power module that is housed in the casing can be ensured without hindrance to space saving and cost saving.

Further, according to the present invention, a semiconductor device includes: an electrically conductive casing; a power module portion housed in the casing and having at least one electrically non-insulating portion located near the casing; and a component fixedly provided in the vicinity of the electrically non-insulating portion and within the casing and having a predetermined capability. The component includes: an essential-capability portion having the predetermined capability; and an electrical-insulation-capability portion connected to the essential-capability portion. The electrical-insulation-capability portion is formed to be provided between the electrically non-insulating portion of the power module portion and the casing.

Preferably, the electrical-insulation-capability portion includes: a support portion integrally molded with the essential-capability portion; and electrically insulating paper wrapped around the support portion.

Still preferably, the electrical-insulation-capability portion is made of a resin integrally molded with the essential-capability portion and having electrical insulation property.

In the semiconductor device of the present invention, the component fixedly provided in the vicinity of the electrically non-insulating portion of the power module portion and within the casing has the electrical-insulation-capability portion in addition to the essential-capability portion having the essential and predetermined capability. The electrical-insulation-capability portion is formed to be provided between the casing and the electrically non-insulating portion of the power module portion near the casing so as to electrically insulate the casing from the electrically non-insulating portion of the power module portion. Thus, it is unnecessary to additionally provide an electrically insulating member having the electrical insulation capability, and thus any dedicated space for attaching the electrically insulating member should not be necessary. In addition, it is unnecessary to provide the electrical insulation capability, which could result in increase in cost, to the electrically non-insulating portion of the power module portion or the casing itself.

Accordingly, for the semiconductor device of the present invention, electrical insulation can be ensured between the electrically conductive casing and the electrically non-insulating portion of the power module housed in the casing without hindrance to space saving and cost saving. Moreover, the electrical-insulation-capability portion and the essential-capability portion are integrally molded and thus the number of components as well as the number of assembly steps can be reduced.

As discussed above, in accordance with the present invention, electrical insulation between the casing and the power module housed in the casing can be ensured without hindrance to space saving and cost saving.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
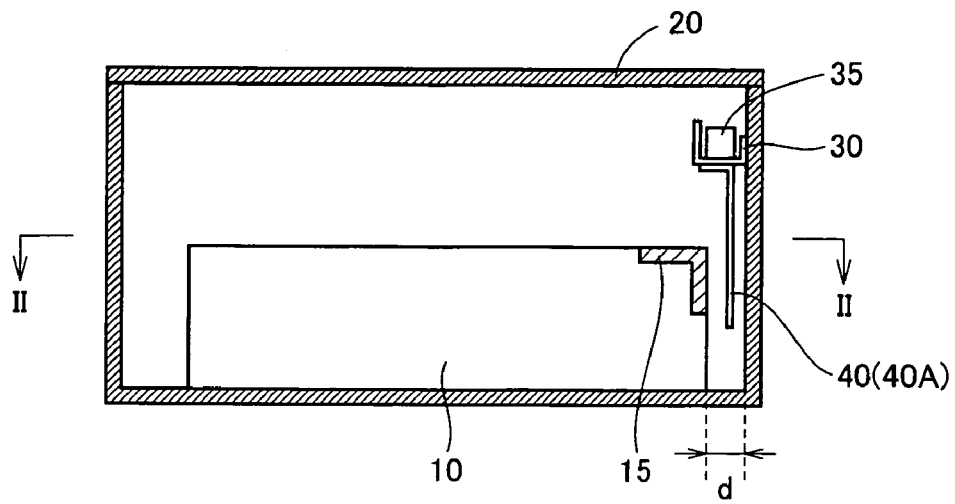
FIG. 1 is a cross-sectional view of an inverter device viewed in the lateral direction and shown as an example of a semiconductor device according to a first embodiment of the present invention.

Embodiments of the present invention are hereinafter described in detail with reference to the drawings. It is noted that like or corresponding components in the drawings are denoted by like reference characters and a description thereof is not repeated.

First Embodiment

Figure 2:
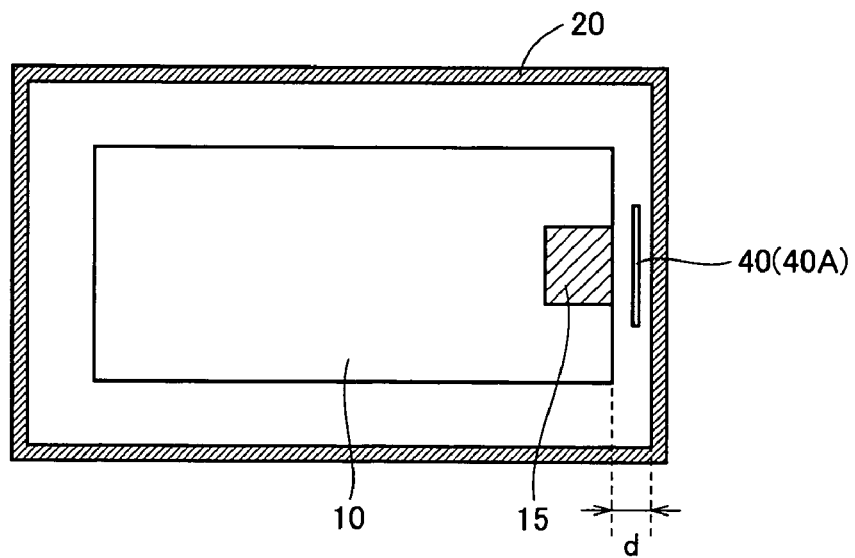
FIG. 2 is a cross-sectional view along II-II of the inverter device shown in FIG. 1.

FIGS. 1 and 2 each show a structure of an inverter device shown as an example of a semiconductor device according to a first embodiment of the present invention. FIG. 1 is a cross-sectional view of the inverter device viewed in the lateral direction and shown as an example of the semiconductor device in the first embodiment of the present invention. FIG. 2 is a cross-sectional view along II-II of the inverter device shown in FIG. 1.

Referring to FIGS. 1 and 2, inverter device 100 includes an IPM 10, a casing 20, a bracket 30, a component-to-be-supported 35, and an electrically insulating member 40. IPM 10 is a high-voltage component including such semiconductor electric-power elements as power transistor and diode as well as electrode plates. In the case where this inverter device 100 is mounted on a hybrid vehicle, for example, a high voltage is generated.

IPM 10 is integrally molded with a molding resin for example and thus most of IPM 10 is electrically insulated from its surroundings. However, a part of the top surface of IPM 10 is provided with a bus bar 15 for carrying electric power to/from internal components of IPM 10. In other words, bus bar 15 is an electrically non-insulating portion where a conductor is exposed.

Casing 20 is a casing for housing various components of this inverter device 100. Casing 20 is made of a metal conductor superior in thermal dissipation and having a certain stiffness, for example, aluminum or iron. Bracket 30 and component-to-be-supported 35 are each one of various components of inverter device 100. Bracket 30 is a component for supporting component-to-be-supported 35 and is attached and thereby secured to casing 20. Component-to-be-supported 35 is supported by bracket 30 and secured with respect to casing 20. This component-to-be-supported 35 is for example a fuse box.

Electrically insulating member 40 has electrical insulation capability and is provided in the gap between bus bar 15 of IPM 10 and casing 20 located near the bus bar. In other words, in inverter device 100, due to the necessity to save space, merely the distance d smaller than the insulation distance can be ensured as a distance between bus bar 15 (electrically non-insulating portion) of IPM 10 and nearby casing 20. Therefore, electrically insulating member 40 is provided in the gap between bus bar 15 of IPM 10 and casing 20 to electrically insulate casing 20 from bus bar 15 of IPM 10.

Here, electrically insulating member 40 is attached and thereby secured to a lower portion of bracket 30 which is provided above the portion that is located between IPM 10 and casing 20 and that requires electrical insulation (namely the portion between bus bar 15 of IPM 10 and nearby casing 20). In other words, this electrically insulating member 40 is not attached to casing 20 or IPM 10 in a space dedicatedly provided for the attachment, but attached and thereby secured to an existing component (bracket 30 in the first embodiment) that is fixedly provided in the vicinity of the portion requiring electrical insulation.

Regarding this inverter device 100, while the insulation distance cannot be ensured between bus bar 15 of IPM 10 and casing 20 due to the necessity to save space, electrically insulating member 40 is provided between bus bar 15 of IPM 10 and casing 20 so as to ensure electrical insulation between bus bar 15 of IPM 10 and casing 20.

In inverter device 100, electrically insulating member 40 is attached and secured to an existing component (bracket 30). Thus, it is unnecessary to additionally provide a space for attaching electrically insulating member 40 to casing 20 or IPM 10.

Figure 3:
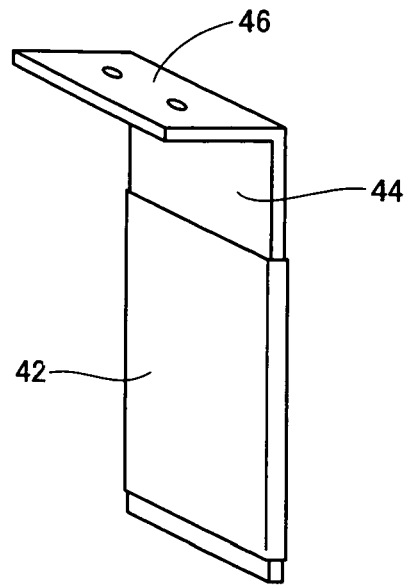
FIG. 3 is an outline drawing of a structure of an electrically insulating member shown in FIG. 1.

FIG. 3 is an outline drawing of a structure of electrically insulating member 40 shown in FIG. 1. Referring to FIG. 3, electrically insulating member 40 includes electrically insulating paper 42 and a support member 44. Electrically insulating paper 42 is wrapped around support member 44 and secured with an adhesive for example to support member 44 in order for electrically insulating paper 42 not to come off. This electrically insulating paper 42 is wrapped around support member 44 in the manner that electrically insulating paper 42 is located between bus bar 15 of IPM 10 and nearby casing 20 in the state where electrically insulating member 40 is attached to bracket 30.

Support member 44 is a thin plate that can be placed in the gap between bus bar 15 of IPM 10 and nearby casing 20, for example, a low-cost iron plate. To support member 44, an attachment portion 46 is provided, and support member 44 is attached with this attachment portion 46 to an existing component (bracket 30).

For electrically insulating member 40, electrically insulating paper 42 is wrapped around support member 44 to form an insulator having a predetermined strength. It is noted that support member 44 itself may not be an insulator. Therefore, the material for support member 44 is not limited to a particular one. Thus, any low-cost material may be selected for support member 44, and thus electrically insulating member 40 contributes to cost reduction of inverter device 100.

It is noted that the above-described support member 44 itself may be formed of an insulator.

Figure 4:
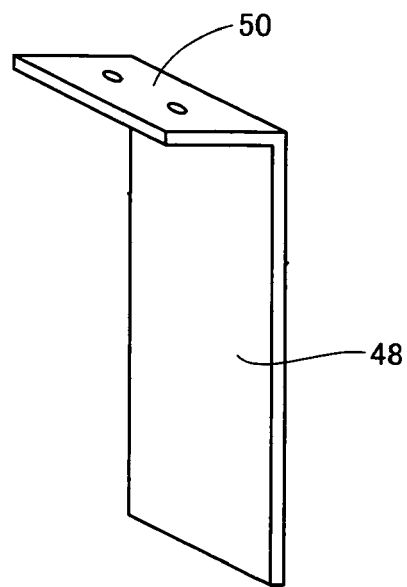
FIG. 4 is an outline drawing of another structure of the electrically insulating member shown in FIG. 1.

FIG. 4 is an outline drawing of another structure of the electrically insulating member shown in FIG. 1. Referring to FIG. 4, this electrically insulating member 40A includes an electrically insulating portion 48 and an attachment portion 50. Insulating portion 48 and attachment portion 50 are made of an integrally molded resin having electrical insulation property, for example, made of polybutyleneterephthalate (PBT). PBT is superior in electrical insulation and also superior in moldability, stiffness and heat resistance for example. Regarding this electrically insulating member 40A, it is unnecessary to wrap electrically insulating paper. Accordingly, the number of components as well as the number of assembly steps can be reduced.

As discussed above, in inverter device 100 of the first embodiment, electrically insulating member 40, 40A is provided between casing 20 and bus bar 15 of IPM 10 that is in close proximity to casing 20, and accordingly electrical insulation is ensured in the space between casing 20 and bus bar 15 of IPM 10 where the insulation distance is insufficient. In other words, it is unnecessary to increase the space for keeping an adequate insulation distance or it is unnecessary that IPM 10 or casing 20 itself has electrical insulation capability which could result in increase in cost. Further, since electrically insulating member 40, 40A is attached to bracket 30 which is an existing component, a dedicated space for attaching electrically insulating member 40, 40A is unnecessary.

Thus, regarding this inverter device 100, electrical insulation between casing 20 and an electrically non-insulating portion (bus bar 15) of IPM 10 can be ensured without hindrance to space saving and cost saving.

Second Embodiment

Figure 5:
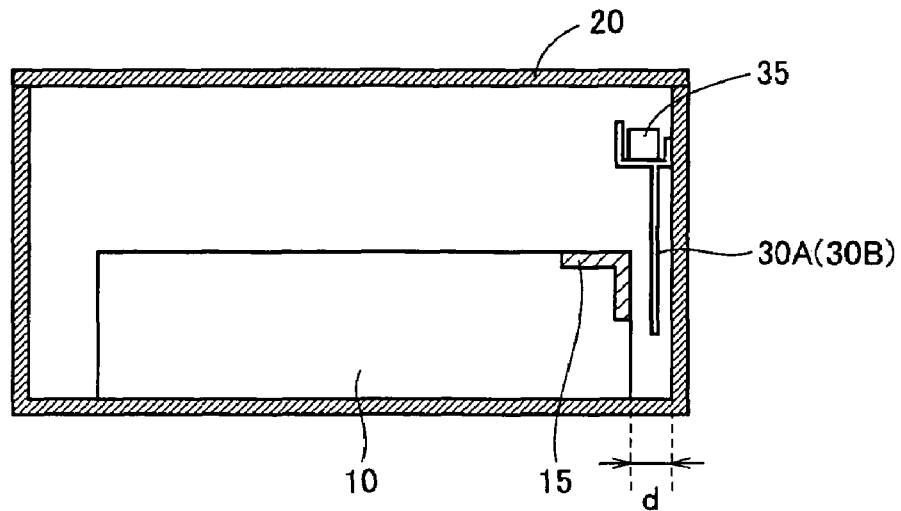
FIG. 5 is a cross-sectional view of an inverter device shown as an example of a semiconductor device according to a second embodiment of the present invention.

FIG. 5 is a cross-sectional view of an inverter device shown as an example of a semiconductor device according to a second embodiment of the present invention. Referring to FIG. 5, this inverter device 100A includes an IPM 10, a casing 20, a bracket 30A and a component-to-be-supported 35.

Bracket 30A and component-to-be-supported 35 are each one of various components of inverter device 100A and bracket 30A is a component for supporting component-to-be-supported 35. Bracket 30A is attached and thereby secured to casing 20.

In addition to the essential capability to support component-to-be-supported 35, bracket 30A has the capability to electrically insulate casing 20 from bus bar 15 of IPM 10. In other words, bracket 30A has a portion with the electrical insulation capability that extends between bus bar 15 of IPM 10 and nearby casing 20 so as to electrically insulate casing 20 from bus bar 15 of IPM 10.

In this inverter device 100A, an adequate insulation distance cannot be ensured between bus bar 15 of IPM 10 and casing 20 due to the necessity to save space. Then, the portion having the electrical insulation capability is added to a component (bracket 30A) that is fixedly provided in the vicinity of a region between IPM 10 and casing 20 where electrical insulation is necessary (namely between bus bar 15 of IPM 10 and nearby casing 20). Since the portion with the electrical insulation capability is provided between bus bar 15 of IPM 10 and casing 20, electrical insulation between bus bar 15 of IPM 10 and casing 20 is ensured.

In other words, regarding inverter device 100A, bracket 30A provided in the vicinity of the portion where electrical insulation is necessary has, in addition to its essential capability (capability to support component-to-be-supported 35), the capability to electrically insulate casing 20 from bus bar 15 of IPM 10. Therefore, attachment of another member having the electrical insulation capability to casing 20 or IPM 10 is unnecessary. Further, any dedicated space for attaching such a member is unnecessary. Furthermore, the number of components is reduced as compared with the first embodiment.

Figure 6:
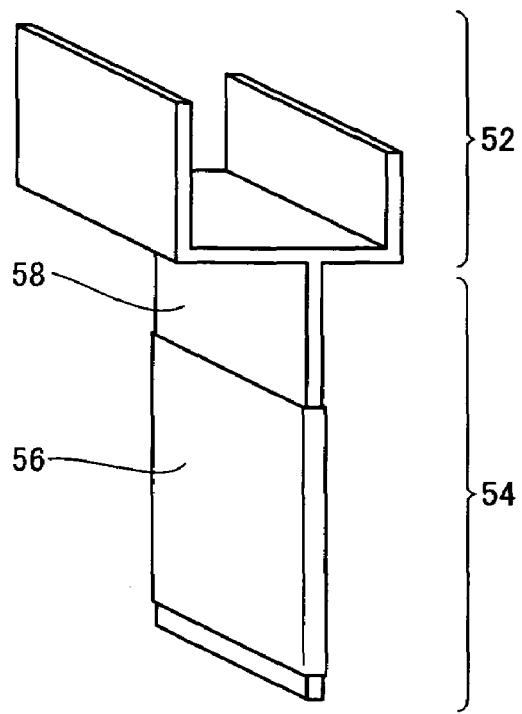
FIG. 6 is an outline drawing of a structure of a bracket shown in FIG. 5.

FIG. 6 is an outline drawing of a structure of bracket 30A shown in FIG. 5. Referring to FIG. 6, bracket 30A includes an essential-capability portion 52 and an electrical-insulation-capability portion 54. Essential-capability portion 52 is a portion having the essential capability of bracket 30A and is a portion for supporting component-to-be supported 35. Essential-capability portion 52 has its side surface attached to casing 20 and thus bracket 30A is secured to casing 20.

Electrical-insulation-capability portion 54 is comprised of electrically insulating paper 56 and a support portion 58. Electrically insulating paper 56 is wrapped around support portion 58 and secured with an adhesive for example to support portion 58 in order for the insulating paper not to come off. Electrically insulating paper 56 is wrapped around support portion 58 in the manner that the insulating paper is located between bus bar 15 of IPM 10 and nearby casing 20 in the state where bracket 30A is attached to casing 20.

Support portion 58 is molded integrally with essential-capability portion 52. Support portion 58 is in the shape of a thin plate that can be placed in the gap between bus bar 15 of IPM 10 and nearby casing 20 and that is formed in the manner that the support portion is placed between bus bar 15 of IPM 10 and nearby casing 20 when bracket 30A is attached to casing 20.

For bracket 30A, essential-capability portion 52 and support portion 58 are integrally molded and electrically insulating paper 56 is wrapped around support portion 58 so as to form electrical-insulation-capability portion 54 having a predetermined strength. Since support portion 58 itself may not be an insulator, the material for support portion 58 is not limited to a particular one. Thus, for essential-capability portion 52 and support portion 58, any low-cost material may be selected as long as the material has a certain stiffness.

Figure 7:
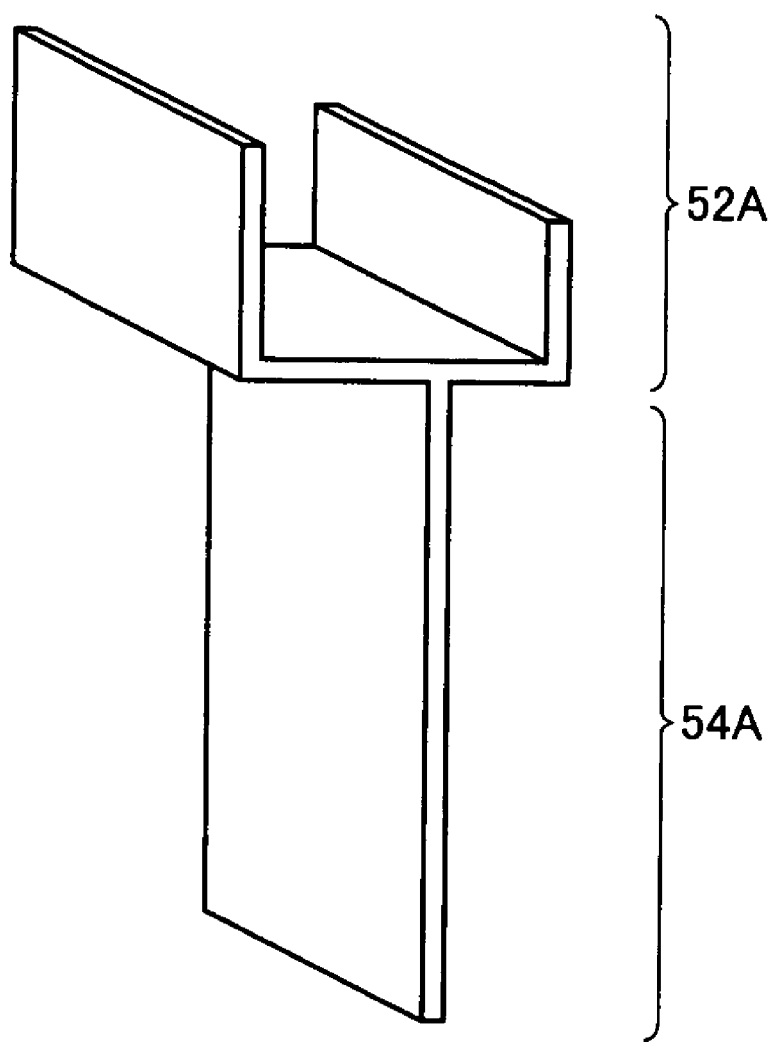
FIG. 7 is an outline drawing of another structure of the bracket shown in FIG. 5.

FIG. 7 is an outline drawing of another structure of the bracket shown in FIG. 5. Referring to FIG. 7, bracket 30B includes an essential-capability portion 52A and an electrical-insulation-capability portion 54A. Essential-capability portion 52A and electrical-insulation-capability portion 54A are made of an integrally molded resin having electrical insulation property, for example, made of PBT. As described above, since PBT is high in stiffness, the capability of essential-capability portion 52A supporting component-to-be-supported 35 is not impaired. Further, with the superior electrical insulation of PBT, electrical-insulation-capability portion 54A ensures electrical insulation between bus bar 15 of IPM 10 and nearby casing 20.

As discussed above, regarding inverter device 100A of the second embodiment, brackets 30A, 30B for supporting component-to-be supported 35 include respective electrical-insulation-capability portions 54, 54A. Since electrical-insulation-capability portion 54, 54A of bracket 30A, 30B is provided between casing 20 and bus bar 15 of IPM 10 that is located near casing 20, electrical insulation between casing 20 and bus bar 15 of IPM 10 where the insulation distance is insufficient is ensured. In other words, any dedicated electrically insulating member having the electrical insulation capability is unnecessary and thus the space for attaching the electrically insulating member should not be required.

Accordingly, inverter device 100A has advantages similar to those of inverter device 100 of the first embodiment. In addition, since the electrical-insulation-capability portion and the essential-capability portion are integrally molded, the number of components can be reduced. Consequently, the number of assembly steps is reduced.

While electrically insulating member 40, 40A is attached to bracket 30 in the first embodiment and brackets 30A, 30B include respective electrical-insulation-capability portions 54, 54A in the second embodiment, the component to which electrically insulating member 40, 40A is attached or the component having electrical-insulation capability is not limited to such a bracket.

The scope of the present invention covers all of the cases where an electrically insulating member is attached to an existing component that is fixedly provided in the vicinity of a region between IPM 10 and nearby casing 20 where electrical insulation is necessary, or the electrical insulation capability is provided to a component fixedly provided in the vicinity of a region between IPM 10 and nearby casing 20 where electrical insulation is necessary.

Further, although the description above is given in connection with the inverter device illustrated as an example of the semiconductor device of the present invention, the scope of the invention is not limited to the inverter device and the invention is applicable for example to a converter device.

Furthermore, the semiconductor device of the present invention is appropriate for the hybrid vehicle and electric vehicle. Specifically, on the hybrid vehicle and electric vehicle, a power conversion device using a power semiconductor device, like inverter or converter, is mounted, and reductions in cost and size as well as high reliability are highly required. The semiconductor device of the present invention does not hinder cost saving (reduction in cost) and space saving and thus can contribute to reductions in cost and size of the vehicle. Moreover, electrical insulation of the semiconductor device can be ensured while the space saving is realized, which also contributes to improvements in reliability of the vehicle.

It is noted that, in the description above, casing 20 corresponds to "casing" of the present invention, and IPM 10 corresponds to "power module portion" of the present invention. Further, bracket 30, 30A, 30B corresponds to "component" of the present invention, and bus bar 15 corresponds to "electrically non-insulating portion of the power module portion" of the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    an electrically conductive casing;
    a power module portion housed in said casing and having at least one electrically non-insulating portion located near said casing;
    a component fixedly provided in the vicinity of said electrically non-insulating portion and within said casing and having a predetermined capability; and
    an electrically insulating member that is attached to said component and that extends into a region between said electrically non-insulating portion of said power module portion and said casing,
    wherein said component is disposed outside of the region, and
    wherein the semiconductor device is an inverter device to be used in a vehicle.

2. The semiconductor device according to claim 1, wherein said electrically insulating member includes:
    a support member attached to said component; and
    electrically insulating paper wrapped around said support member.

3. The semiconductor device according to claim 1, wherein said electrically insulating member is made of a resin having electrical insulation property.

4. A semiconductor device comprising:
    an electrically conductive casing;
    a power module portion housed in said casing and having at least one electrically non-insulating portion located near said casing; and
    a component fixedly provided in the vicinity of said electrically non-insulating portion and within said casing and having a predetermined capability, wherein said component includes:
        an essential-capability portion having said predetermined capability; and
        an electrical-insulation-capability portion connected to said essential-capability portion, and
        said electrical-insulation-capability portion is formed so as to extend into a region between said electrically non-insulating portion of said power module portion and said casing,
    wherein said essential-capability portion is disposed outside of the region, and
    wherein the semiconductor device is an inverter device to be used in a vehicle.

5. The semiconductor device according to claim 4, wherein said electrical-insulation-capability portion includes:
    a support portion integrally molded with said essential-capability portion; and
    electrically insulating paper wrapped around said support portion.

6. The semiconductor device according to claim 4, wherein said electrical-insulation-capability portion is made of a resin integrally molded with said essential-capability portion and having electrical insulation property.

7. The semiconductor device according to claim 1, wherein the electrically insulating member provides electrical insulation between the entire electrically non-insulating portion and the casing.

8. The semiconductor device according to claim 4, wherein the essential-capability portion is mounted directly to the casing and wherein said predetermined capability includes providing support for another component.

* * * * *

UNITED STATES PATENT AND TRADEMARK OFFICE
CERTIFICATE OF CORRECTION

PATENT NO. : 7,455,553 B2  Page 1 of 1
APPLICATION NO. : 11/370868
DATED : November 25, 2008
INVENTOR(S) : Takaji Kikuchi and Takeshi Menjo It is certified that error appears in the above-identified patent and that said Letters Patent is hereby corrected as shown below:

The correct residences for the Assignees are as follows:

TOYOTA JIDOSHA KABUSHIKI KAISHA: Toyota-shi, Japan

KYOHO MACHINE WORKS, LTD.: Toyota-shi, Japan

Signed and Sealed this

Twenty-ninth Day of December, 2009

David J. Kappos
*Director of the United States Patent and Trademark Office*

UNITED STATES PATENT AND TRADEMARK OFFICE
CERTIFICATE OF CORRECTION

PATENT NO. : 7,455,553 B2
APPLICATION NO. : 11/370868
DATED : November 25, 2008
INVENTOR(S) : Takaji Kikuchi and Takeshi Menjo It is certified that error appears in the above-identified patent and that said Letters Patent is hereby corrected as shown below:

Title Page, Item (75) Inventors:

The correct residences for the inventors are as follows;

Takaji Kikuchi, Toyota-shi, Japan

Takeshi Menjo, Toyota-shi, Japan

Signed and Sealed this

Twenty-third Day of March, 2010

David J. Kappos
*Director of the United States Patent and Trademark Office*